(12) United States Patent
Shen et al.

(10) Patent No.: US 6,420,272 B1
(45) Date of Patent: Jul. 16, 2002

(54) METHOD FOR REMOVAL OF HARD MASK USED TO DEFINE NOBLE METAL ELECTRODE

(75) Inventors: Hua Shen, San Francisco, CA (US); David Edward Kotecki, Orono, ME (US); Satish D. Athavale, Fishkill, NY (US); Jenny Lian, Wakkill, NY (US); Gerhard Kunkel, Fishkill, NY (US); Nimal Chaudhary, Poughkeepsie, NY (US)

(73) Assignees: Infineon Technologies A G, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/460,700

(22) Filed: Dec. 14, 1999

(51) Int. Cl.⁷ ............................................. H01L 21/00
(52) U.S. Cl. ...................... 438/702; 438/704; 216/16; 216/39
(58) Field of Search ............................... 438/702, 704; 216/16, 39

(56) References Cited

U.S. PATENT DOCUMENTS 4,040,893 A * 8/1977 Ghezzo ..................... 156/659
5,786,235 A * 7/1998 Eisele et al. ................. 438/53
6,004,471 A * 12/1999 Chuang ....................... 216/16

* cited by examiner

*Primary Examiner*—Robert Kunemund
(74) *Attorney, Agent, or Firm*—Stanton Braden

(57) ABSTRACT

In semiconductor dynamic random access memory circuits using stacked capacitor storage elements formed using high permittivity dielectric material, it is typical to form the stacked capacitors using noble metal electrodes. Typically, the etching process for the noble metal electrodes requires the use of a hard mask patterning material such as silicon oxide. Removal of this hard mask frequently results in damage to the dielectric surface surrounding the patterned noble metal electrode. A method of removing the hard mask material without damaging the surrounding surface includes the steps of: depositing a soft mask photoresist material over the composite surface, including the hard masked covered noble metal electrode and the dielectric surface, in a manner such that the soft mask material is thinner over the region of the noble metal electrode; removing the portion of the soft mask material over the noble metal electrode leaving the soft mask material over the dielectric surface; etching the hard mask material with the soft mask material protecting the dielectric surface; and removing the remaining portion of the soft mask material.

8 Claims, 4 Drawing Sheets

METHOD FOR REMOVAL OF HARD MASK USED TO DEFINE NOBLE METAL ELECTRODE

FIELD OF THE INVENTION

Figure 1:
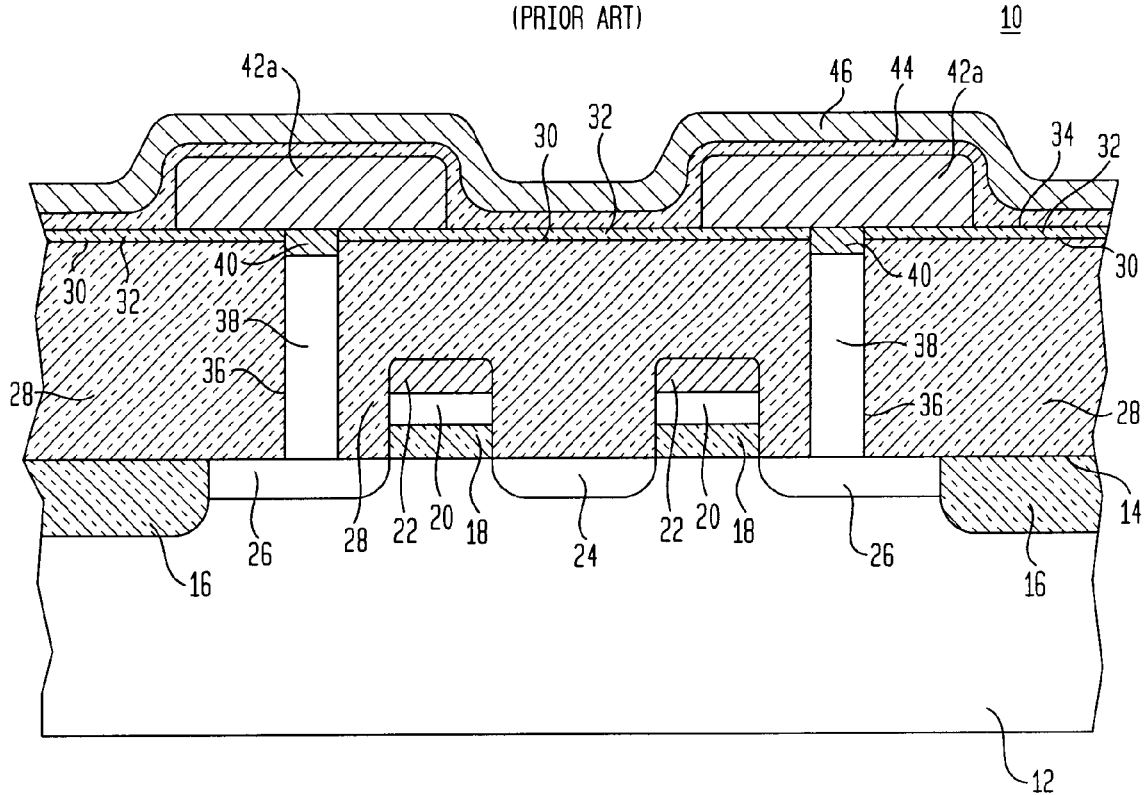

This invention relates to semiconductor technology, and more particularly, to methods of defining noble metal electrodes of storage cell capacitors for use in semiconductor random access memory devices using high-permittivity dielectric capacitors.

BACKGROUND OF THE INVENTION

The density of semiconductor random access memory has been increasing at a rapid pace ever since this technology was first introduced. This remarkable increase in density has been brought about by advances in various areas of technology, including lithography, dry patterning, and thin film deposition, and by improvements in DRAM architecture resulting in a more efficient cell utilization. In such a DRAM memory, information is stored as electric charge on a capacitor, and this charge is accessed by a single field effect transistor (FET). As the density of the DRAM memory circuits has increased as indicated, both the amount of circuit area which can be allocated to the storage capacitor and the potential to which the capacitor can be charged has decreased. These two effects result in a reduction in the amount of charge that can be stored by the capacitor. The minimum amount of charge that must be stored in order to obtain reliable operation of the DRAM circuit is determined by the sensitivity limits of sense amplifiers, parasitic capacitance and alpha-particle considerations. Although this minimum amount of charge has decreased through succeeding generations of DRAM design, it is expected that the required storage capacitance will remain nearly constant at 25–40 fF/cell in future generations of DRAMs. Achieving this required capacitance while the physical size of the storage capacitor decreases will be a major challenge in fabricating future generations of DRAMs.

Higher capacitance density can be achieved by the use of: complex electrode structures providing a large surface area within a small lateral area; thinner capacitor dielectric; and higher permittivity capacitor dielectric materials. In general, increasing the surface area, such as, for example, by the use of trench capacitors, leads to increased complexity and hence increased cost. The use of thinner dielectric thickness leads to reduced Voltage capability and decreased reliability. Much work in recent years has focused on the development of high permittivity dielectric materials for use in DRAM storage capacitors.

DRAM circuits manufactured to date contain primarily capacitors fabricated utilizing a thin dielectric layer composed of silicon dioxide and/or a mixture of silicon dioxide and silicon nitride, sandwiched between electrodes made of doped crystalline or polycrystalline silicon. Modifying this material set will break a 25 plus year precedent in which long-term dielectric performance and reliability have been firmly established. Incorporating a high permittivity dielectric material into a DRAM storage capacitor drives the need not only for new dielectric materials, but also for new electrode and barrier materials, and for the processing methods to form and pattern these new materials.

Thin film perovskite materials, such as barium-strontium titanate, have emerged as a leading contender as a dielectric material for future generations of DRAMs. Most schemes for the integration of the perovskite dielectric material into the DRAM structure have used noble-metal or noble-metal-oxide electrodes in combination with a deposited conductive diffusion barrier. The deposited conductive diffusion barrier is required to prevent the inter-diffusion of the electrode material with, and to prevent the diffusion of oxygen into, the silicon elements of the DRAM integrated circuit during the formation of the thin film perovskite material. The noble-metal or noble-metal-oxide electrode material is required to sustain the high temperatures of 550 to 700° C. used during the formation of perovskite films such as barium-strontium titanate. Suitable electrode materials have been found to be noble metals such as Pt, Ir, Ru, and Pd, and noble-metal-oxides such as $IrO_2$ and $RuO_2$.

An important characteristic of the metal electrode material is the ease with which it can be dry etched, in order that techniques can be developed which allow low cost, high quality patterning of the electrodes. For the above listed materials, Ru and $RuO_2$ are easily dry etched, but such etching requires the use of dangerous materials and also produces dangerous by-products whose presence is not generally desirable in the workplace. The remaining materials are difficult to dry etch due to the absence of any low temperature volatile etch products, a pre-requisite for a low-cost dry etch process. Platinum is typically patterned by reactive ion etching (RIE) using a Cl-based chemistry and a patterned hard mask. Suitable hard mask materials include silicon oxide, silicon nitride, titanium, titanium oxide, and titanium nitride.

A problem arising from the use of this technique is that the hard mask must now be removed from the surface of the remaining platinum electrode. The area of the surface of the semiconductor body surrounding the platinum electrode is an insulator, typically silicon oxide or silicon nitride, materials which have similar etch characteristics and properties as the hard mask materials which must be removed from the top surface of the platinum electrode. Any simple process which removes the hard mask from the surface of the platinum electrode will also remove some of the insulting material surrounding the electrode, resulting in a degradation of this surface and a potential problem with undercutting of the platinum electrode.

It is desirable to provide a method of fabricating semiconductor random access memory circuits containing storage capacitors utilizing high permittivity dielectric materials in which the requisite noble metal electrode structures are formed without undue damage to the surrounding insulator surfaces and without the introduction of undesirable undercutting of the electrodes.

SUMMARY OF THE INVENTION

We have found that the fabrication of semiconductor random access memory circuits containing storage capacitors fabricated using thin film perovskite materials such as barium-strontium titanate can be simplified, and made more controllable and reliable, if hard mask materials used in the process of defining noble metal electrodes are removed using the inventive method of fabrication described herein. The present inventive method of fabrication makes use of the original tool set and materials used to fabricate conventional random access semiconductor memory circuits with only minor changes to the conventional process flow.

After the electrode is patterned, a layer of material, such as photoresist, or other spin-coated film or reflowable material, is used to protect the region surrounding the hard mask material while the hard mask material is etched. The photoresist is applied in a manner such that the protective photoresist is self-aligned to the hard mask material, and no additional lithography steps are required to define the masking photoresist. Additional intermediate layers of dielectric may also be used to provide adherence.

The photoresist material is applied to the semiconductor wafer as a liquid which will form a planar surface. Subsequent drying processes may result in some loss of planarity of this surface. If this loss of planarity is excessive, the surface of the photoresist may be again planarized by the use of processes such as chemical mechanical polishing (CMP). Because the surface of the photoresist is planar, the thickness of photoresist over the noble metal electrode and the covering hard mask is thinner than the thickness of photoresist over the region surrounding the noble metal electrode. An amount of photoresist material equal to the thickness of the photoresist over the noble metal electrode is removed from the surface of the photoresist. This exposes the surface of the hard mask while leaving photoresist in the region surrounding the noble metal electrode. The hard mask material can now be etched so as to expose the noble metal electrode therebelow. The surface surrounding the noble metal electrode is protected by the remaining photoresist. The photoresist can then be easily removed without causing damage to the noble metal electrode or to an insulating layer around same.

Viewed from a first aspect, the present invention is directed to a method for removing a mask covering a top surface of region which rests on a support surface of material similar in composition to that of the mask without removing a portion of the support surface. The method comprises the steps of: forming a masking layer over the mask and over portions of the support surface and covering sidewalls of the region; the masking layer being thinner where same transverses a top of the region than where same covers the support surface; removing a thickness of the masking layer equal to the thickness of same over the top of the region so as to expose at least a top surface of the mask; etching the exposed top surface of the mask to remove the mask and thus expose the top portion of the region with the masking layer protecting the support surface from being removed; and removing the remaining masking layer.

Viewed from a second aspect, the present invention is directed to a method of removing a hard mask from a top surface of a metal layer which is on top of a first insulating layer which has similar characteristics to the hard mask without damaging the insulating layer. The method comprises the steps of: forming a second insulating layer over the hard mask and first insulating layer; forming a masking layer over the second insulating layer, said masking layer having a lesser thickness where same is formed over the hard mask than elsewhere; etching the masking layer so as to remove all of same from over the top of the metal layer while leaving same covering surrounding areas and exposing the portion of the second insulating layer covering the top of the metal layer; etching the exposed portion of the second insulating layer to expose the hard mask; and etching the hard mask so as to expose the top of the metal layer.

Viewed from a third aspect,: the present invention is directed to a method of removing a silicon oxide hard mask from a top surface of a platinum metal layer which is on top of a first insulating layer of silicon oxide, which has similar characteristics to the silicon oxide hard mask, without damaging the silicon oxide insulating layer. The method comprises the steps of: forming a second insulating layer of silicon nitride over the silicon oxide hard mask and silicon oxide first insulating layer; forming a masking layer of photoresist material over the second silicon nitride insulating layer, said photoresist masking layer having a lesser thickness where same is formed over the silicon oxide hard mask than elsewhere; etching the photoresist masking layer so as to remove all of same from over the top of the platinum metal layer while leaving same covering surrounding areas and exposing the portion of the silicon nitride second insulating layer covering the top of the platinum metal layer; etching the exposed portion of the silicon nitride second insulating layer to expose the silicon oxide hard mask; and etching the silicon oxide hard mask so as to expose the top of the platinum metal layer.

Viewed from a fourth aspect, the present invention is directed to a method of removing a hard mask from a top surface of a noble metal layer which is on a top surface of a first insulating layer which has been formed on the top surface of a semiconductor body, said semiconductor body being of a first conductivity type and having had formed therein at least one insulated gate field effect transistor having a gate electrode, a gate dielectric layer lying between the gate electrode and a top surface of the semiconductor body, the portion of the semiconductor body underlying the gate dielectric layer separating output regions formed in the semiconductor body and which are of the opposite conductivity type of the body, one of said output regions being connected to a first terminal of a conductive conduit traversing through the first insulating layer, a second terminal of said conduit lying in a plane of the top surface of the first insulating layer, and an upper portion of said conducting conduit consisting of a conducting material impervious to the diffusion of oxygen, said impervious material being in contact with aforementioned noble metal layer. The method comprises the steps of: forming a second insulating layer over the hard mask and the first insulating layer; forming a masking layer over the second insulating layer, said masking layer having a lesser thickness where same is formed over the hard mask than elsewhere; etching the masking layer so as to remove all of same from over the top of the metal layer while leaving same covering surrounding areas and exposing the portion of the second insulating layer covering the top of the metal layer; etching the exposed portion of the second insulating layer to expose the hard mask; and etching the hard mask so as to expose the top of the metal layer.

The present invention will be better understood from the following more detailed description taken with the accompanying drawings and claims

BRIEF DESCRIPTION

FIG. 1 shows a sectional view of a representative prior art stacked capacitor memory structure; and FIGS. 2–7 illustrate a novel process for fabricating a bottom electrode of a high-permittivity capacitor structure in accordance with the present invention.

DETAILED DESCRIPTION

Referring now to FIG. 1, there is shown a sectional view of a prior art semiconductor structure 10, which is a dynamic random access semiconductor memory cell using a stacked capacitor structure that utilizes a high-permittivity dielectric. Structure 10 is formed within and upon semiconductor body 12 which has a top surface 14. A region 16 is an isolation region which isolates pairs of memory cells. Two insulated gate field effect transistors are shown, each having gate dielectric 18 and polysilicon gate metallization 20, which is connected to a silicide word address line 22. Both transistors share a common diffused output region 24 which is connected to a bit line which is not shown in the drawing, and individual diffused separated output regions 26. The surface 14 of the semiconductor body 12 is covered with a dielectric region 28. The stacked capacitor structure is fabricated on an upper surface 30 of the dielectric region 28. An optional surface layer 32, having a top surface 34, of a different dielectric material, may be formed on the top surface 30. A via 36, filled with conducting material 38, typically polysilicon, brings a connection to the output region 26 of the transistor to the surface of the layer 32. The upper surface of the conducting material 38 is covered with a barrier layer 40. Optionally, the barrier layer 40 may extend beyond the via 36 across the top surface 30 of the dielectric region 28, or the top surface 34 of the optional surface layer 32. A noble metal bottom electrode 42a is formed on the surface 34, centered over, and covering, the top of the via 36. A layer 44 of high-permittivity dielectric material is formed on the surface of the structure. This layer 44 is covered with a conductor layer 46 to form a top electrode of the storage capacitor.

The subject of this invention is a novel method of patterning the noble metal bottom electrode 42a. In the prior art methods of fabricating the structure of FIG. 1, a layer of noble metal was formed on the surface 34 of FIG. 1, a layer of hard mask material, such as silicon oxide, was formed above the layer of noble metal, and this hard mask layer was patterned, leaving regions of the hard mask material where it was desired to form the bottom electrodes 42a. The excess noble metal was then etched using the hard mask as an etch mask. Because the hard mask material has etch properties similar to the surface material 28, or the optional surface material 32, it has proved difficult to remove the hard mask material without incurring damage to the surfaces 34 or 30.

Figure 2:
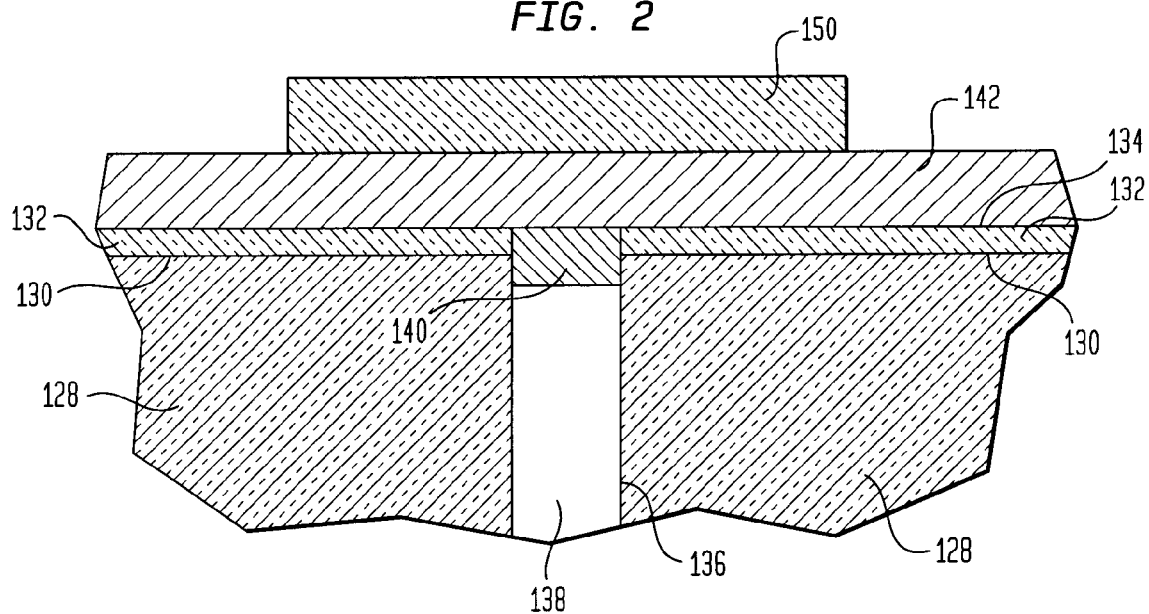

FIG. 2 shows a sectional view of an area in FIG. 1 above one of the barrier layers 40, where a high-permittivity capacitor is to be formed in accordance with the method of the present invention. The portions of FIG. 2 have reference numbers with 100 added to the reference number of the corresponding portion in FIG. 1. The structure in FIG. 2 is shown at a point in the processing sequence where a layer of noble metal 142 has been formed on a surface 134 of an optional surface layer 132. A hard mask material has been deposited on the surface of noble metal 142 and patterned to form the hard mask 150. The hard mask 150 is centered over the top of the via 136, and extends beyond the perimeter of the via 136. An optional adhesion layer, not shown, may be formed on the surface of the noble metal prior to the formation of the layer of hard mask material.

Figure 3:
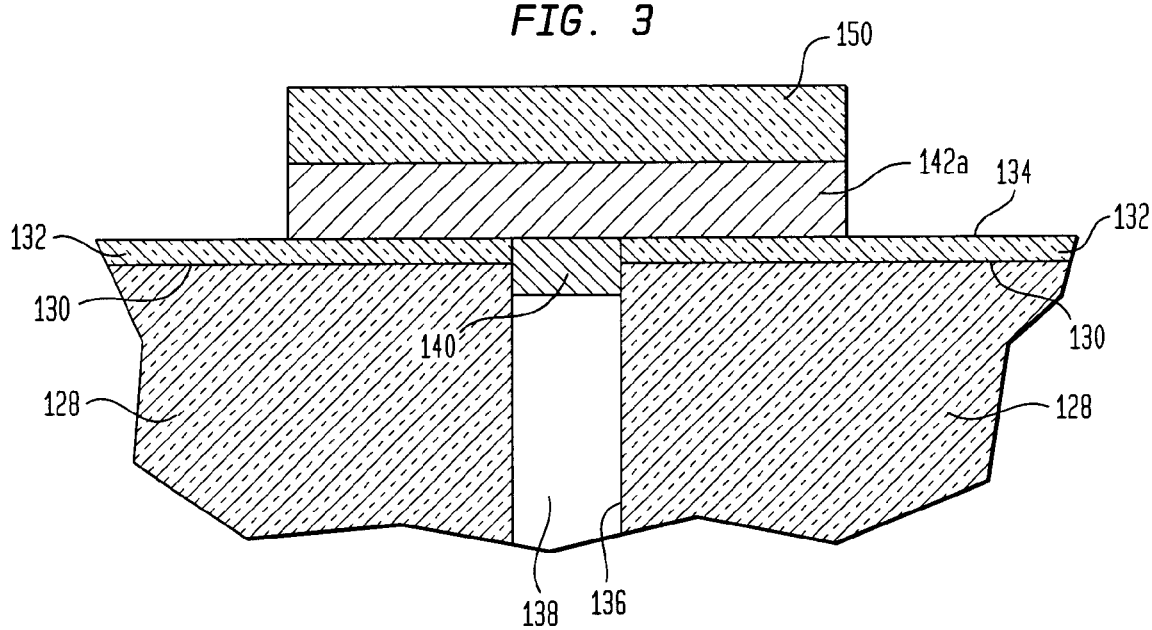

FIG. 3 shows the structure of FIG. 2 after the noble metal has been etched to form the bottom noble metal electrode 142a.

Figure 4:
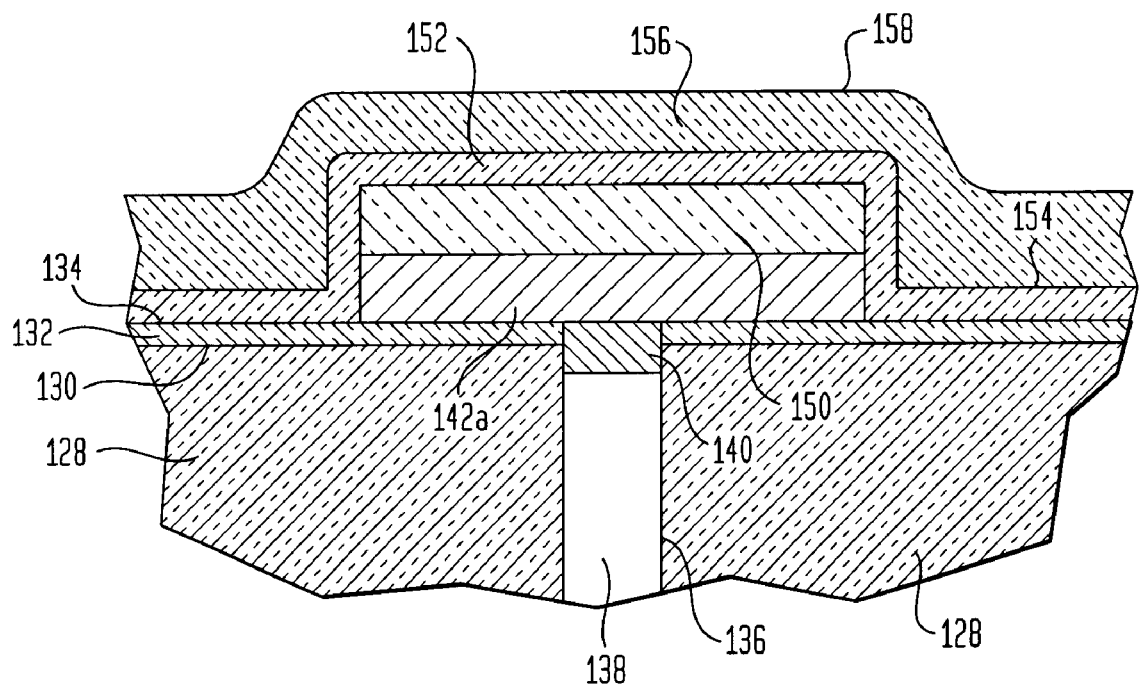

FIG. 4 shows the structure of FIG. 3 after the surface of the structure has been covered with a layer 152 of dielectric material, typically silicon nitride, and after a layer 156 of organic material, typically photoresist material, with a top surface 158, has been deposited on the surface 154 of layer 152. Because of the nature of the process for applying photoresist material, the thickness of the photoresist over the noble metal bottom electrode 142a, with the remaining hard mask 150, will be thinner than the photoresist layer in the area surrounding the bottom electrodes 142a. Typically the process for applying photoresist consists of depositing a quantity of the liquid photoresist on the top surface of the semiconductor body, and then rotating, or spinning, the semiconductor body around an axis perpendicular to the surface of the semiconductor body. This results in spreading the photoresist liquid out over the surface of the semiconductor body with the thickness of the film of photoresist dependent upon the viscosity of the liquid photoresist, the speed of rotation of the semiconductor body, and the quantity of material deposited on the surface. It is observed that, if the film of liquid photoresist is sufficiently thick, the top surface of the film of liquid photoresist will assume a planar shape. When the liquid photoresist is subsequently dried during various baking processes, the photoresist material will shrink and some departure from planararity of the surface 158 will occur. If the surface 158 were to remain planar, the difference in the thickness of the photoresist over the noble metal electrode 142a and the thickness of photoresist over the area surrounding electrode 142a would be just the difference between the height of the surface 154 over the noble metal electrode 142a and the height of the surface 154 over the area surrounding the electrode 142a. If the surface 158 has some departure from planarity, the difference in photoresist thickness would be different than that estimated above. If the surface 158 is found to have deviation from planarity such that the integrity of the process described herein would be affected, the surface 158 could be planarized using any of the known processes for planarizing such a surface, such as chemical mechanical polishing (CMP).

Figure 5:
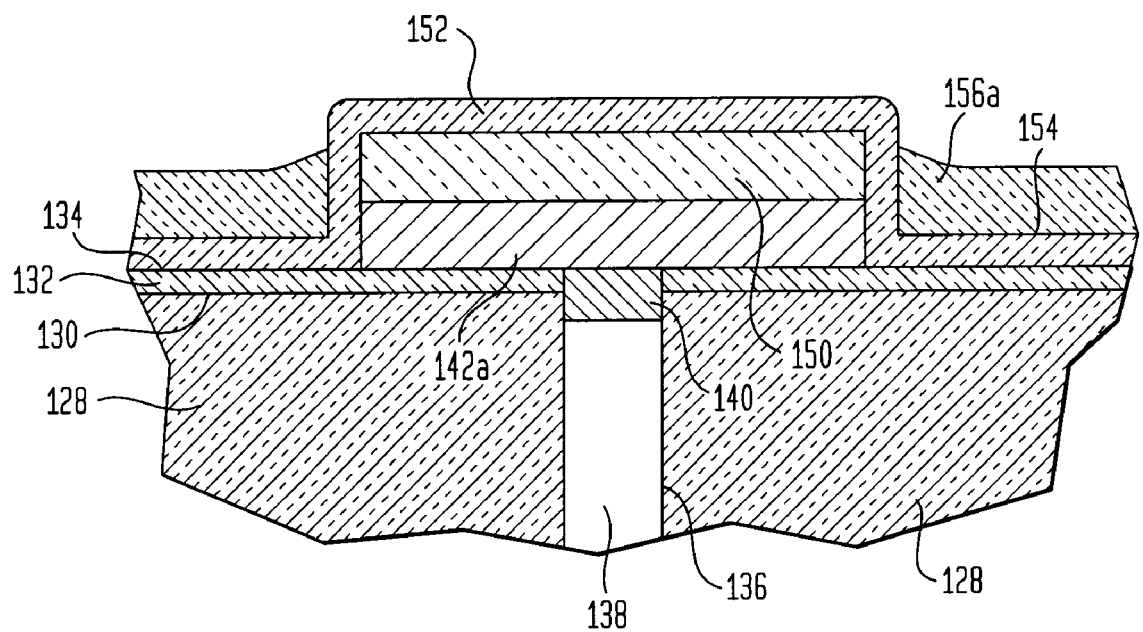

FIG. 5 shows the structure of FIG. 4 after the semiconductor body has been subjected to a process to remove the photoresist material from the surface of the semiconductor body over the bottom noble metal electrode 142a. A suitable process for removing this photoresist might be Chemical Downstream Etching, CDE. Because the thickness of photoresist in the area surrounding the bottom electrode 142a is thicker than the layer of photoresist on the upper surface of bottom electrode 142a, all photoresist can be removed from the surface of bottom electrode 142a while still leaving a layer 156a of photoresist material in the area surrounding bottom electrode 142a, as is shown in FIG. 5.

Figure 6:
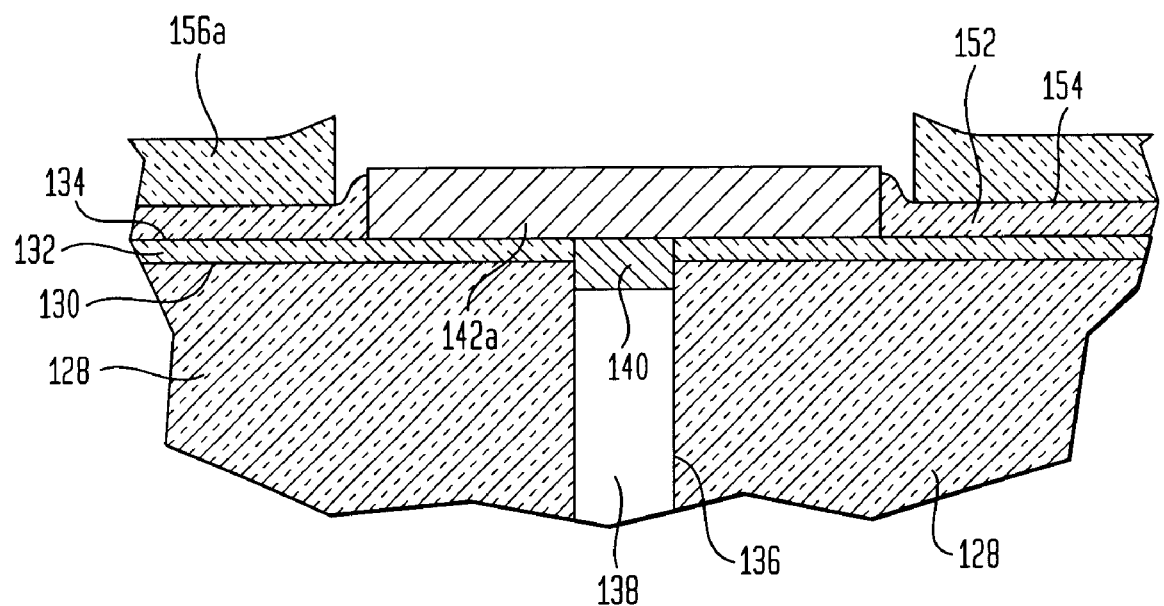

FIG. 6 shows the structure of FIG. 5 after the semiconductor body has been subjected to an etch process which removes the dielectric layer 152 and the hard mask material 150 from the surface of the bottom noble metal electrode 142a. The layer 156a of photoresist protects the layer 152 during this process.

Figure 7:
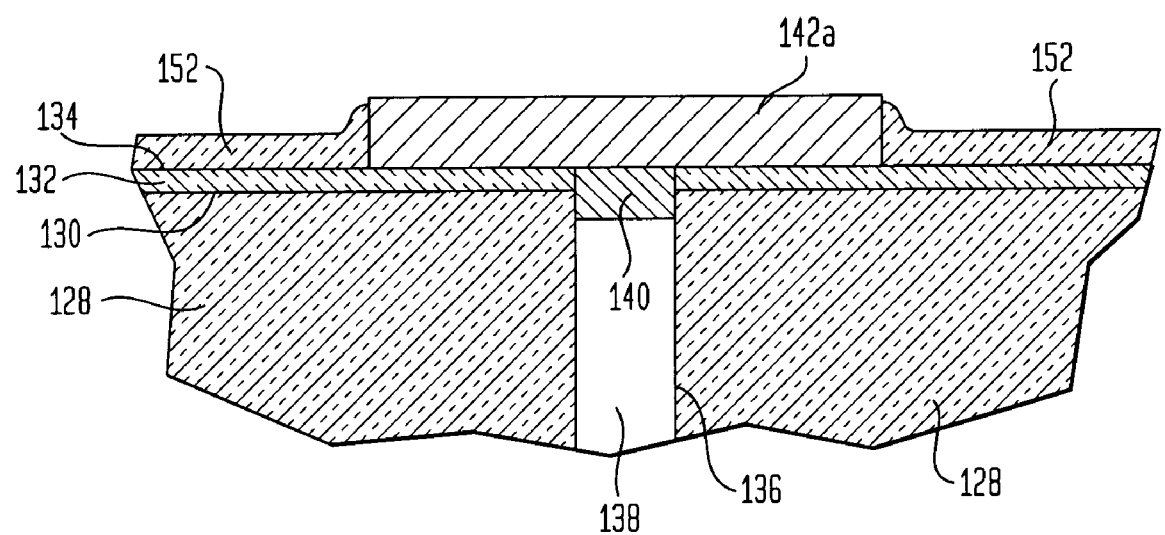

FIG. 7 shows the structure of FIG. 6 after the remaining photoresist layer 156a has been removed from the surface of the semiconductor body. After suitable cleaning procedures, the semiconductor body is now ready for the formation of the layers of high-permittivity dielectric material 44 and conductor layer 46 as depicted in FIG. 1.

It is to be understood that the particular structures and processes described are merely illustrative of the general principles of the invention. Various modifications are possible without departing from the spirit and scope of the invention. For example, other materials with suitable characteristics may be substituted for the layer of photoresist described above. Further, processes other than the CDE process described above may be used to remove the material from the region over the surface of the bottom noble metal electrode while leaving the thicker material in the area surrounding the bottom electrode. Furthermore, the concepts described herein may be applied to other types of devices and transistors, such as, for example, bipolar transistors, and in general to the fabrication of all types of devices and structures where it is necessary to remove a hard mask material from a specific area at a higher elevation while leaving undisturbed the surrounding lower elevation area.

What is claimed is:

1. A method for removing a mask covering a top surface of region which rests on a support surface of material similar in composition to that of the mask without removing a portion of the support surface comprising the steps of:

forming a masking layer over the mask and over portions of the support surface and covering sidewalls of the region such that the surface of the masking layer is planar, wherein the masking layer is thinner where same transverses a top of the region than where same covers the support surface;

removing a thickness of the masking layer equal to the thickness of same over the top of the region so as to expose at least a top surface of the mask;

etching the exposed top surface of the mask to remove the mask and thus expose the top portion of the region with the masking layer protecting the support surface from being removed; and removing the remaining masking layer.

2. A method for removing a hard mask from a top surface of a metal layer which is on top of a first insulating layer which has similar characteristics to the hard mask without damaging the insulating layer comprising the steps of:

forming a second insulating layer over the hard mask and first insulating layer;

forming a masking layer over the second insulating layer such that the surface of the masking layer is planar, wherein the masking layer has a lesser thickness where same is formed over the hard mask than elsewhere;

etching the masking layer so as to remove all of same from over the top of the metal layer while leaving same covering surrounding areas and exposing the portion of the second insulating layer covering the top of the metal layer;

etching the exposed portion of the second insulating layer to expose the hard mask; and etching the hard mask so as to expose the top of the metal layer.

3. The method of claim 2 wherein the masking layer is chosen from a class of materials consisting of spin-coated organic and inorganic material.

4. The method of claim 2 wherein the masking layer is chosen from the class of materials commonly known as photoresist material.

5. The method of claim 2 wherein a Chemical Downstream Etch (CDE) is used to remove the masking layer from the top of the metal layer.

6. The method of claim 2 wherein Chemical Mechanical Polishing (CMP) is used to remove the masking layer from the top of the metal layer.

7. A method of removing a silicon oxide hard mask from a top surface of a platinum metal layer which is on top of a first insulating layer of silicon oxide, which has similar characteristics to the silicon oxide hard mask, without damaging the silicon oxide insulating layer comprising the steps of:

forming a second insulating layer of silicon nitride over the silicon oxide hard mask and silicon oxide first insulating layer;

forming a masking layer of photoresist material over the second silicon nitride insulating layer, said photoresist masking layer having a lesser thickness where same is formed over the silicon oxide hard mask than elsewhere;

etching the photoresist masking layer so as to remove all of same from over the top of the platinum metal layer while leaving same covering surrounding areas and exposing the portion of the silicon nitride second insulating layer covering the top of the platinum metal layer;

etching the exposed portion of the silicon nitride second insulating layer to expose the silicon oxide hard mask; and etching the silicon oxide hard mask so as to expose the top of the platinum metal layer.

8. A method of removing a hard mask from a top surface of a noble metal layer which is on a top surface of a first insulating layer which has been formed on the top surface of a semiconductor body, said semiconductor body being of a first conductivity type and having had formed therein at least one insulated gate field effect transistor having a gate electrode, a gate dielectric layer lying between the gate electrode and a top surface of the semiconductor body, the portion of the semiconductor body underlying the gate dielectric layer separating output regions formed in the semiconductor body and which are of the opposite conductivity type of the body, one of said output regions being connected to a first terminal of a conductive conduit traversing through the first insulating layer, a second terminal of said conduit lying in a plane of the top surface of the first insulating layer, and an upper portion of said conducting conduit consisting of a conducting material impervious to the diffusion of oxygen, said impervious material being in contact with aforementioned noble metal layer, said method comprising the steps of:

forming a second insulating layer over the hard mask and the first insulating layer;

forming a masking layer over the second insulating layer, said masking layer having a lesser thickness where same is formed over the hard mask than elsewhere;

etching the masking layer so as to remove all of same from over the top of the metal layer while leaving same covering surrounding areas and exposing the portion of the second insulating layer covering the top of the metal layer;

etching the exposed portion of the second insulating layer to expose the hard mask; and etching the hard mask so as to expose the top of the metal layer.

* * * * *